(12) United States Patent
Widmer

(10) Patent No.: US 7,616,072 B2
(45) Date of Patent: Nov. 10, 2009

(54) INTEGRATED CIRCUIT AND RECEIVER OF A GLOBAL POSITIONING SYSTEM (GPS)

(75) Inventor: Meik Wilhelm Widmer, Elchingen (DE)

(73) Assignee: Atmel Automotive GmbH, Heilbronn (DE)

( * ) Notice: Subject to any disclaimer, the term of this patent is extended or adjusted under 35 U.S.C. 154(b) by 37 days.

(21) Appl. No.: 11/850,663

(22) Filed: Sep. 5, 2007

(65) Prior Publication Data

US 2008/0061897 A1 Mar. 13, 2008

Related U.S. Application Data

(60) Provisional application No. 60/842,043, filed on Sep. 5, 2006.

(51) Int. Cl.
*H03B 5/12* (2006.01)
(52) U.S. Cl. .............. 331/173; 331/117 R; 331/117 FE
(58) Field of Classification Search ............ 331/117 R, 331/117 FE, 167, 182, 185, 175, 116 R, 116 FE, 331/158, 160, 172, 173

See application file for complete search history.

(56) References Cited

U.S. PATENT DOCUMENTS

| | | | | |
|---|---|---|---|---|
| 6,292,061 | B1 * | 9/2001 | Qu ............................... | 331/17 |
| 7,307,486 | B2 * | 12/2007 | Pernia et al. ................. | 331/173 |
| 2002/0022465 | A1 * | 2/2002 | McCullagh et al. ......... | 455/260 |
| 2004/0263271 | A1 * | 12/2004 | Yin .............................. | 331/158 |
| 2006/0267704 | A1 * | 11/2006 | Stevenson et al. ........... | 331/185 |

* cited by examiner

*Primary Examiner*—Robert Pascal
*Assistant Examiner*—Ryan J. Johnson
(74) *Attorney, Agent, or Firm*—Muncy, Geissler, Olds & Lowe, PLLC

(57) ABSTRACT

A global positioning system and integrated circuit with a differential oscillator and with a starting circuit connected to the differential oscillator, wherein the differential oscillator has a current mirror for setting an operating current through each of the two branches, the starting circuit has at least one switch connected to the current mirror, and has a starting means connected to the at least one switch, and the current mirror, the at least one switch, and the starting means are wired in such a manner that the operating current in each of the two branches of the differential oscillator is increased during a starting phase, which phase is a function of the starting means.

17 Claims, 2 Drawing Sheets

INTEGRATED CIRCUIT AND RECEIVER OF A GLOBAL POSITIONING SYSTEM (GPS)

This nonprovisional application claims priority to U.S. Provisional Application No. 60/842,043, which was filed on Sep. 5, 2006, and is herein incorporated by reference.

BACKGROUND OF THE INVENTION

1. Field of the Invention

The present invention relates to an integrated circuit and a receiver of a global positioning system (GPS).

2. Description of the Background Art

An oscillator with a precise or adjustable oscillator frequency is typically required for a receiver of a global positioning system. For the oscillator, LC resonant circuits with an inductance (L) and a capacitance (C) may be used. Often, receivers of this nature are battery-operated.

SUMMARY OF THE INVENTION

It is an object of the present invention to provide a global positioning system with an oscillator or with an integrated circuit having an oscillator that does not require regulation of an operating point of the oscillator.

Accordingly, an integrated circuit on a semiconductor chip with a differential oscillator and with a starting circuit for starting oscillation of the oscillator is provided. To this end, the differential oscillator and the starting circuit are connected to one another. In this context, the differential oscillator has two preferably symmetrically designed branches in which the alternating oscillator current is phase-shifted by 180°. Preferably, the oscillator signal can be tapped differentially at the output of the oscillator.

The differential oscillator can have a current mirror for setting an operating current through each of the two branches. A current mirror mirrors the current from one mirror branch to one or more additional mirror branches. In this regard, the relationship of the mirror currents to one another is determined by the mirror factor. The operating current determines the operating point of active elements of the oscillator, and thus their electrical characteristics, such as, e.g., their gain. Active elements of the oscillator can be, for example, single transistors or cascodes.

The starting circuit has at least one switch and a starting means. The at least one switch here is connected to the current mirror. The starting means is connected to the at least one switch. The starting means in this context includes a number of wired components that perform the starting function. In this regard, the current mirror, the at least one switch, and the starting means are wired in such a manner that the operating current in each of the two branches of the oscillator is increased during a starting phase that is a function of the starting means.

The at least one switch is preferably a field-effect transistor, a bipolar transistor, or another semiconductor switch that can be switched off. To increase the operating current, it is preferably switchable between at least two current values.

The starting means defines the starting phase, in particular its duration. For example, the starting means is designed as a digital counter. According to an aspect of the invention, the starting means is a timing element that has a time constant composed of analog components. The timing element advantageously has a resistor, a capacitor, and a threshold means connected to the at least one switch, in order to compare a capacitor voltage of the capacitor with a threshold of the threshold means, and to drive the switch as a function of this comparison. For example, a field-effect transistor with a threshold voltage as threshold value, or a threshold switch (Schmitt trigger) may be used as the threshold means.

According to a variant, the at least one switch is connected to the current mirror in such a manner that a mirror ratio of the current mirror is switchable to increase the operating current in the starting phase with respect to an operating phase. In this regard, the mirror ratio in long-term operation preferably is not greater than 10:1, while the mirror ratio in the starting phase exceeds 10:1 for example, and preferably is not greater than 20:1. Advantageously, the mirror ratio in the starting phase lies between 13:1 and 20:1.

According to another variant, provision is made that the differential oscillator has a first circuit section (HF) with an oscillator signal. The oscillator signal is an oscillator current and/or an oscillator voltage that has an alternating component at the oscillator frequency, for example. The integrated components in this circuit section act as impedances on the amplitude, frequency, and/or phase of the oscillator signal. In this variant development, the differential oscillator additionally has a second circuit section. The second circuit section is separated from the high frequency oscillator signal in the manner of a decoupling. To this end, a number of impedances, for example one or more capacitors and/or inductors, are wired, essentially decoupling this second circuit section. The effect on the oscillator signal of impedances resulting from components in this second circuit section can thus be ignored in this variant development. It is preferred for the at least one switch to likewise be connected in the second circuit section.

In yet another variant, provision is made for the current to be switched off in the starting circuit except for leakage currents in an operating phase following the starting phase. Leakage currents arise, for example, as a result of tunneling currents through insulators, currents through reverse-biased PN junctions of switched-off transistors, or currents through already fully charged capacitors. The switching off of current is accomplished in that at least one of the transistors of a series circuit between the supply terminals is switched off or a capacitor in this series circuit becomes fully charged and remains charged during the operating phase.

According to yet another variant, provision is made for the starting circuit to have a first switch and a second switch. In this context, the first switch is connected to one branch of the oscillator, and the second switch is connected to the other branch of the oscillator. In this variant development, the first switch is designed as a transistor and the second switch is designed as a transistor. For example, MOSFETs or junction field effect transistors can be connected. In advantageous fashion, at least one electrical property of these two transistors differs as a result of tolerances in the production process or suitable design measures. This difference can accomplish a differential interference signal upon turn-on and/or turnoff of the transistors, exciting the oscillator into oscillation. It is also possible for this purpose to drive the transistors differently, for example with a slight time offset. It is also possible, for example, to drive only one transistor so that the operating current is increased in only one of the two branches of the oscillator during the starting phase.

In yet another variant, provision is made for the operating current in the starting phase to be increased by a factor of at least 1.3 as compared to an operating phase following the starting phase. The increase advantageously lies in a range between a factor of 1.3 and a factor of two. This variant development is preferably combined with the change in the mirror factor.

According to yet another variant, the differential oscillator has an LC resonant circuit and two transistors connected to the LC resonant circuit. Preferably, the LC resonant circuit is connected to collectors and bases of the transistors, wherein the transistors are npn bipolar transistors, for example. Alternatively, the LC resonant circuit can also be connected to collectors and emitters of the transistors in a common base circuit. Alternatively, if field effect transistors are connected, they are operated in a common source or common gate circuit, for example, and are appropriately connected to the LC resonant circuit. Together with additional components, the transistors form a negative differential resistance value that is advantageous for the oscillation of the oscillator. This is accomplished in that these two transistors are differentially coupled together (positive feedback). The operating current in the relevant branch of the differential oscillator determines the operating point of the relevant transistor here and thereby also its gain.

In yet another, variant, provision is made that the two transistors connected to the LC resonant circuit are part of the current mirror. The transistors are thus operated with a dual function, both as amplifying elements of the differential oscillator with regard to an AC signal of the oscillation and as current sources of the relevant branch of the oscillator with regard to the operating current defined as a DC current. As current sources, they thus define their own operating current and hence the operating point.

According to yet another variant, the timing element produces a duration ($t_S$) of the starting phase corresponding at least to the product of a quality factor (Q) of the LC resonant circuit and a duration (T) of one period of the oscillation. The starting phase begins, for example, with a pulse following switch-on of the supply voltage. After this pulse, the operating current is increased for the duration of the starting phase. The minimum duration ($t_S$) of the starting phase results as:

$$T_S = Q \cdot T = Q \cdot 1/f_{Osz}$$

where $f_{Osz}$ is the oscillator frequency.

In yet another variant, provision is made for the two transistors connected to the LC resonant circuit to be wired in a common emitter circuit. In this context, the emitters of the two transistors are preferably connected to a supply voltage terminal of the oscillator through a number of resistors in order to set the operating point. The supply voltage terminal is ground or a more positive (VCC) or more negative supply voltage, for example. A direct connection is possible in this regard. Alternatively, the connection is made through a filter, for example a low-pass filter, to filter out high-frequency interference signals in advance.

In order to obtain virtual DC points within the oscillator, provision is made in yet another variant development for the emitters to be short-circuited with regard to the oscillator's oscillator frequency band through a number of capacitors. The oscillator frequency band here includes all frequencies that can be generated by the oscillator. The short circuit is interpreted as a low impedance, which is of course nonzero, through a capacitor with regard to this oscillator frequency band. The short circuit here can be accomplished by means of a single capacitor in that this capacitor is connected directly to both emitters. A short circuit through two or more capacitors is also possible, wherein each emitter is connected to a third node, for example ground, through a capacitor.

In yet another variant, provision is made for each emitter of the relevant branch of the oscillator to be connected to the supply voltage terminal through a series circuit of resistors. At least one resistor of this series circuit is connected to the at least one switch in such a manner that this resistor is bridged by means of the at least one switch for the starting phase to increase the operating current. If the switch is, e.g., an npn bipolar transistor, the at least one resistor is connected to the emitter and the collector of this bipolar transistor. If the switch is, e.g., an NMOS field-effect transistor, the at least one resistor is connected to the drain and the source of this NMOS field-effect transistor.

According to yet another variant, each of the two transistors, in a common emitter circuit with the resistors connected to the emitters, constitutes a mirror branch of the current mirror. The bases of the two transistors in the common emitter circuit are coupled to an additional mirror branch of the current mirror. In the simplest case, the coupling can take place by means of base series resistors. The additional mirror branch is preferably designed as part of the second circuit section of the oscillator and can thus be ignored as an impedance in designing the first circuit section for the oscillation of the oscillator.

In yet another variant, provision is made for the additional mirror branch to have a mirror transistor and a series circuit of resistors. The series circuit of resistors here is connected to the mirror transistor and the supply voltage terminal. At least one resistor of this series circuit is connected to the at least one switch in such a manner that this resistor is not bridged by means of the at least one switch to increase the operating current for the starting phase. In contrast, this resistance is bridged by the switch in the operating phase.

According to an embodiment, the oscillator is designed to be tunable. To this end, the oscillator preferably has a number of voltage-dependent variable-capacitance diodes, also known as varactor diodes. These are connected in parallel with an inductor and thus are part of the LC resonant circuit.

The variant developments described above are especially advantageous both individually and in combination. In this regard, all variant developments can be combined with each other. Possible combinations are explained in the description of the example embodiments in the figures. However, the possibilities described there for combinations of the variant developments are not exhaustive.

Another aspect of the invention is a receiver of a global positioning system (GPS). This receiver has an antenna for receiving satellite signals. A receiver circuit of the receiver is connected to the antenna and has an integrated circuit with a differential oscillator and a starting circuit. The differential oscillator and starting circuit are connected to one another. The differential oscillator has a current mirror for setting an operating current through each of the two branches. The starting circuit has at least one switch connected to the current mirror and has a timing element connected to the switch as a starting means for the oscillator. The current mirror, the at least one switch, and the timing element functioning as a starting means are connected here in such a manner that the operating current in each of the two branches of the oscillator is increased during a starting phase, wherein the starting phase is a function of the timing element functioning as starting means.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
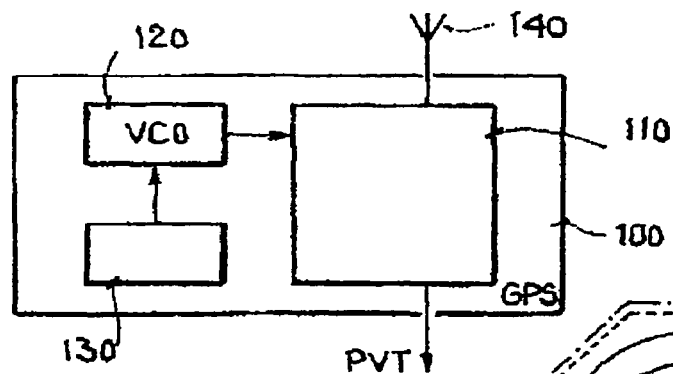
FIG. 1 is a schematic block diagram of a GPS receiver.

In FIG. 1, an example embodiment for a receiver 100 of a global positioning system (GPS) is shown as a schematic block diagram. The receiver 100 has an antenna 140 for receiving satellite signals. The current position is determined from the received signals in a receiver circuit 110 connected to the antenna 140, and is emitted at its output as a global position signal PVT (position, velocity, time). The output of a GPS receiver includes, for navigation in particular, essentially the following components: position (e.g., latitude and longitude), as well as speed and time.

The receiver 100 also has a tunable oscillator 120 and a starting circuit 130 for starting the tunable oscillator 120. In this regard, it is only necessary to use a tunable oscillator 120, for example, when the oscillator frequency needs to be adjusted within an oscillator frequency band or regulated to a specific frequency value. For example, the oscillator frequency can be set by a voltage. In this case, the tunable oscillator is also referred to as a voltage-controlled oscillator (VCO.) The starting circuit 130 starts the oscillation of the oscillator 120 during a starting phase. In an operating phase after the starting phase, the oscillator 120 continues to oscillate independently of the starting circuit 130.

In this regard, the starting circuit 130 can be designed such that it does not influence the characteristics of the oscillator 120 during the operating phase. Moreover, the starting circuit must permit reliable starting of the oscillation of the oscillator 120 under the boundary conditions arising during the use of the oscillator 120. Such boundary conditions include, for example, an operating temperature range, a supply voltage range, ranges of characteristics of the components as a function of possible process dispersions in the manufacture of the components, or the like.

Figure 2:
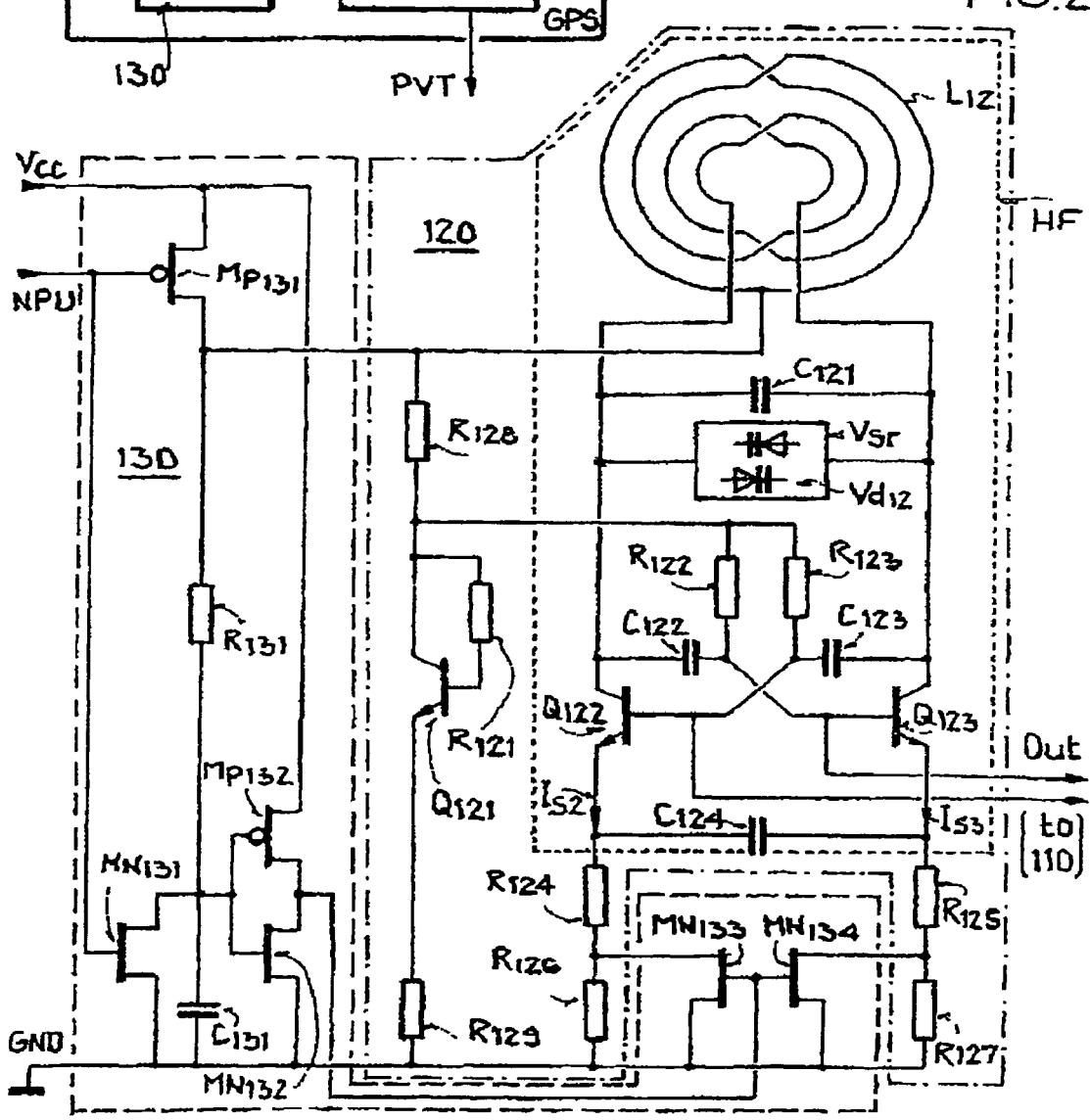
FIG. 2 is a schematic circuit diagram of a tunable LC oscillator and a starting circuit.

Such an oscillator 120 with a starting circuit 130 is shown schematically as a circuit diagram in FIG. 2, for example. In this context, the oscillator 120 and the starting circuit 130 are preferably used in a global positioning system (GPS) such as is shown in FIG. 1, since this example embodiment has surprising advantages for a global positioning system. Naturally, an oscillator 120 with a starting circuit 130, as shown in FIG. 2, can also be used in another device such as a transmitter or receiver—for example for stationary or mobile communication.

In FIG. 2, the circuit of the oscillator 120 is highlighted by surrounding it with a dotted/dashed line. The starting circuit 130 is highlighted by surrounding it with a dashed line. In addition, the components of the oscillator 130 that accomplish the oscillation as a high-frequency circuit section HF are highlighted by surrounding them with a dotted line. In this context, an alternating current depending on the oscillation signal flows through these components, and/or an AC voltage depending on the oscillation signal drops across these components.

The oscillator 120 from FIG. 2 will be explained first. The oscillator has an integrated inductor L12, the one capacitor C121, and one or more varactor diodes Vd12 that act as variable capacitors and are connected in parallel. The parallel circuit including the inductor L12, capacitor C121, and varactor diodes Vd12 forms a parallel LC resonant circuit. The quality factor of this resonant circuit is, e.g., between five and twelve. Other components of the oscillator 120 that are important for the oscillation are constructed symmetrically, so that the oscillator 120 is designed as a differential oscillator 120.

Each of the npn bipolar transistors Q122 and Q123 is connected in a branch of the differential oscillator 120 in a common emitter circuit. To this end, the emitters of the npn bipolar transistors Q122 and Q123 are shorted for the oscillator signal at the oscillator frequency through the capacitor C124. The emitter currents IS2 and IS3 here have a DC component and an AC component, wherein the AC components of the two currents IS2 and IS3 are phase-shifted 180° from one another. As a result of the short circuit for the oscillator frequency by the capacitor C124, only the DC component of the currents IS2 and IS3 flows through the resistors R124, R125, R126 and R127.

The LC resonant circuit (L12, C121, Vd12) is connected to the collectors of the npn bipolar transistors Q122 and Q123. The base of the npn bipolar transistor Q122 is connected to the collector of the npn bipolar transistor Q123 through a capacitor C123. The base of the npn bipolar transistor Q123 is connected to the collector of the npn bipolar transistor Q122 through a capacitor C122. In this way, the two npn bipolar transistors Q122 and Q123 are provided with positive feedback, forming a negative impedance necessary for the oscillation. In addition, connected to the base of each npn bipolar transistor Q122 and Q123 is a resistor R122 or R123 that supplies a base current for setting an operating current at an operating point of the npn bipolar transistors Q122 and Q123. The two resistors R122 and R123 are also connected to one another, so that an AC component phase-shifted by 180° is shorted together through this connection.

For a symmetrical construction of the oscillator 120, the resistors R122 and R123 are equal. The capacitors C122 and C123 are also equal. Moreover, the npn bipolar transistors Q122 and Q123 are alike, and are identical within the scope of manufacturing tolerances. This differential oscillator 120 produces, at its differential output Out, a differential oscillator signal with signal components phase-shifted by 180°.

Figure 3:
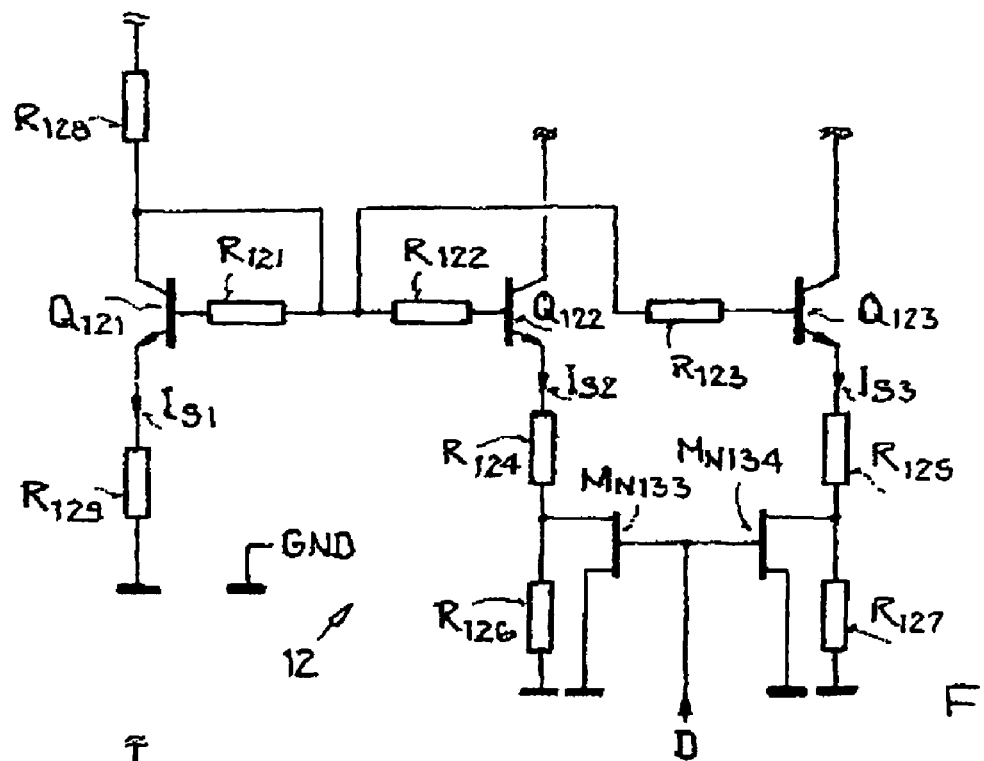
FIG. 3 is a schematic detail view of the circuit diagram from FIG. 2 with a switchable current mirror.

To set two identical operating currents (DC component of the currents IS2 and IS3) for identical operating points of the npn bipolar transistors Q122 and Q123, the oscillator has a current mirror 12 that is shown in FIG. 3 as a detail view of the circuit diagram from FIG. 2. Also shown in FIG. 2 are the currents IS2 and IS3, wherein their DC component is set by the current mirror 12. The following applies to the DC components here:

$$IS2 = IS3 = k \cdot IS1$$

where k is a mirror factor that is less than or equal to 10.

This is achieved in that the npn bipolar transistors Q121, Q122 and Q123 are identical within the scope of manufacturing tolerances. Moreover, the resistors R121, R122, and R123 are equal. The following applies for the resistors R124, R125, R126, R127 and R129:

$$R129 \cdot k = R124 + R126 = R125 + R127$$

where k is once again the mirror factor. The current IS1 flowing through the resistor R128, the npn bipolar transistor Q121, and the resistor R129 thus flows, magnified by the mirror factor k, through each of the npn bipolar transistors Q122 and Q123 as the operating current (DC component of the currents IS2 and IS3) and determines their operating point.

In addition, FIG. 3 shows the field-effect transistors MN133 and MN134, which can be designed as NMOS, for example. When the field-effect transistors MN133 and MN134 are switched on by a switching signal D, the field-effect transistor MN133 shorts the resistor R126 to ground, and the field-effect transistor MN134 shorts the resistor R127 to ground. This increases the mirror ratio k from:

$$k=(R124+R126)/R129=(R125+R127)/R129$$

to:

$$k=R124/R129=R125/R129$$

so that the operating current is correspondingly increased. According to the invention, the operating current through the oscillator 120 in the starting phase is to be increased as compared to a subsequent operating phase. To this end, according to the example embodiment from FIG. 3, the mirror ratio k of the current mirror 12 is increased in that the field-effect transistors MN133 and MN134 short the resistors R126 and R127 of the current mirror 12 as a result of the switching signal D. The switching signal D here is produced by the starting circuit 130, as is explained below on the basis of FIG. 2.

According to the example embodiment from FIG. 2, the starting circuit 130 and the oscillator are connected to a supply voltage terminal (ground) GND. In addition, the starting circuit is connected to another supply voltage terminal VCC and to a signal output NPU. The signal output NPU, which is known per se, is active-low (negative power up) to switch on the power. In other words, after turn-on of the operating voltage at the terminals VCC and GND, this signal output NPU produces a low signal following a certain time delay.

Also connected to the supply terminals VCC and GND is an inverter having the MOS transistors MN132 and MP132, the output of which produces the switching signal D and is connected to the NMOS transistors MN133 and MN134. The input of the inverter (MN132, MP132) is connected to a timing element having the capacitor C131 and the resistor R131. A sequence of operation of the starting circuit 130 is described below.

First, when a supply source, for example a battery, is connected, the supply voltage VCC rises in any desired manner, for example according to a ramp function. The signal output NPU is initially still at a high voltage, so that the voltage at the signal output NPU is essentially equal to the supply voltage VCC, so that the PMOS transistor MP131 is switched off. In contrast, the NMOS transistor MN131 immediately conducts as soon as its threshold voltage is reached. The input of the inverter (MN132, MP132) is thus at a low voltage. As a result, the output D is at a high voltage, and the NMOS transistors MN133 and MN134 are switched on.

The PMOS transistor MP131 is switched on by a subsequent low signal at the signal output NPU; in contrast, the NMOS transistor MN131 is then switched off. The capacitor C131 of the timing element is charged through the resistor R131 of the timing element. The charge in the capacitor C131 is initially so small here that the output of the inverter (MN132, MP132) initially remains at a high voltage. Thus the NMOS transistors MN133 and MN134 also remain switched on. At the same time, the oscillator 120 is connected to the supply voltage VCC through the PMOS transistor MP131. The oscillator 120 begins to oscillate. In this context the switched-on NMOS transistors MN133 and MN134 establish an operating current increased by at least a factor of 1.3, allowing reliable starting of the oscillator.

When the voltage at the capacitor C131 reaches the threshold voltage of the NMOS transistor MN132, the output signal D of the inverter (MN132, MP132) switches to a low voltage. This switches off the NMOS transistors MN133 and MN134. The starting phase is thus ended. The oscillator 120 switches to the operating phase with a reduced operating current relative to the starting phase. Even a very small difference between the transistors MN133 and MN134 can be helpful for the starting process. Especially when the oscillator is not yet oscillating, a differential signal between the bases of the transistors can excite the desired oscillation.

The example embodiment shown in FIG. 2 has the following advantages: The reliability of starting the oscillator is increased without requiring regulation of the operating current. The starting of oscillation here takes place independently of influencing factors that arise during operation, such as operating temperature, operating voltage or manufacturing-related process dispersion of the components. The starting circuit 130 is designed to have no effect on the oscillator 120 in this regard, in that the switching transistors MN133 and MN134 are connected to areas of the oscillator 120 that carry essentially no AC oscillator signal component and hence have essentially only a DC voltage.

Consequently, the nonlinear drain-gate capacitances of the switching transistors MN133 and MN134 also do not form parasitic capacitances for the oscillator 120 which would have to be taken into account in designing the oscillator 120. Another advantage is that the starting circuit 130 draws no current from the supply voltage terminals VCC,GND in the operating phase apart from leakage currents of the MOS transistors MP131, MN131, MN132, MP132, MN133, MN134, and the capacitor C131. A battery, for example that of a mobile GPS unit, is thus loaded less. Jitter and the phase noise of the oscillator 120 are significantly reduced as compared to regulation of the operating current of the oscillator 120.

Figure 4:
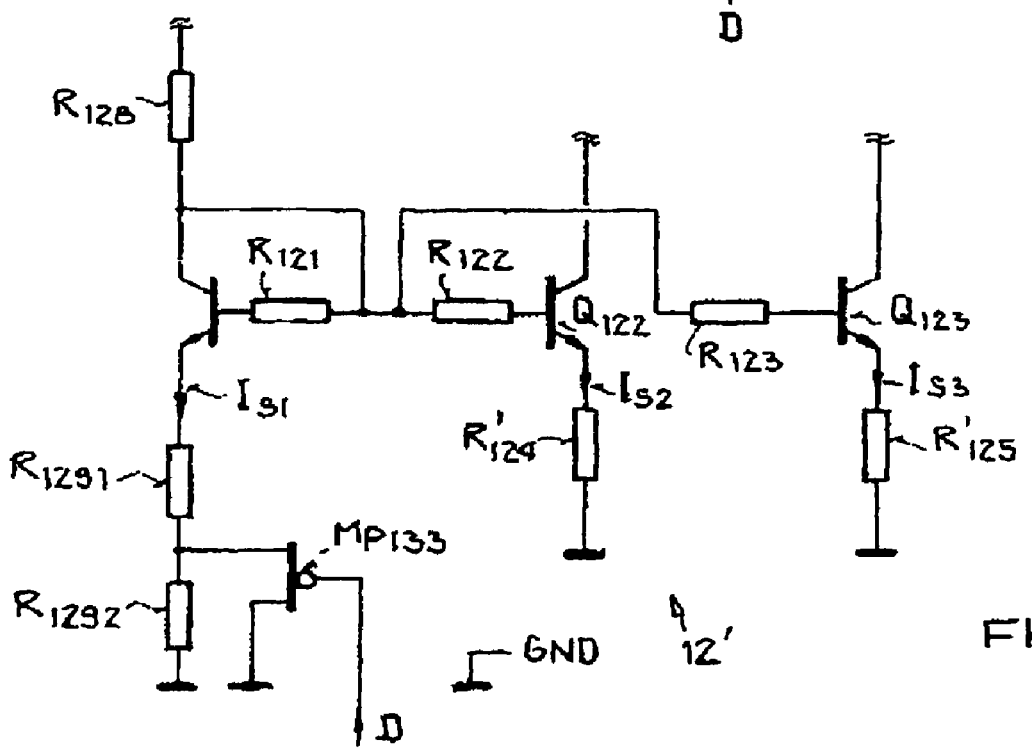
FIG. 4 is another variant embodiment of a switchable current mirror.

FIG. 4 shows an embodiment that is a variation on FIG. 3. The current mirror 12' in FIG. 4 has a PMOS switching transistor MP133 in the additional mirror branch of the current mirror 12'. The effect of the switching of the PMOS switching transistor MP133 here is similar to that in FIG. 3. The switching signal D is initially at a high voltage. The PMOS switching transistor MP133 is switched off.

The mirror factor k' in the starting phase is given by:

$$k=R'124/(R1291+R1292)=R'125/(R1291+R1292).$$

The mirror factor during the starting phase is thus increased relative to the subsequent operating phase, wherein the mirror factor k' during the operating phase is given by:

$$k=R'124/R1291=R'125/R1291.$$

During the operating phase, the output of the inverter switches to low and outputs a low voltage as switching signal D. As a result of this, the PMOS transistor MP133 conducts and shorts the resistor R1292 to ground GND.

Naturally, the invention is not limited to the example embodiments shown, but also includes variant embodiments not shown. For example, only bipolar transistors could be used, or only field-effect transistors. Moreover, it is possible within the scope of the invention to operate the transistors Q122 and Q123 in a common base circuit. It is also possible within the scope of the invention to use a digital timing element in the form of a counter.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:

1. An integrated circuit comprising:
   a differential oscillator having a first circuit section with an oscillator signal and a second circuit section separated from the oscillator signal by a number of impedances in the manner of a decoupling; and
   a starting circuit connected to the differential oscillator,
   wherein the differential oscillator has a current mirror for setting an operating current through each of its two branches,
   wherein the starting circuit has at least one switch connected to the current mirror in the second circuit section and has a starter connected to the at least one switch, and
   wherein the current mirror, the at least one switch, and the starter are wired in such a manner that an operating current in each of the two branches of the differential oscillator is increased during a starting phase that is a function of the starter.

2. The integrated circuit according to claim 1, wherein the starter is a timing element.

3. The integrated circuit according to claim 2, wherein the timing element has a resistor, a capacitor, and a threshold device connected to the at least one switch, in order to compare a capacitor voltage of the capacitor with a threshold of the threshold device, and to drive the switch as a function of this comparison.

4. The integrated circuit according to claim 1, wherein the at least one switch is connected to the current mirror in such a manner that a mirror ratio of the current mirror is switchable to increase the operating current.

5. The integrated circuit according to claim 1, wherein a current is switched off in the starting circuit except for leakage currents in an operating phase following the starting phase.

6. The integrated circuit according to claim 1,
   wherein the staffing circuit has a first switch and a second switch,
   wherein the first switch is connected to one branch of the differential oscillator, and the second switch is connected to the other branch of the differential oscillator,
   wherein the first switch is a transistor and the second switch is a transistor, and
   wherein at least one electrical property of these two transistors is different.

7. The integrated circuit according to claim 1, wherein the operating current in the starting phase is increased by a factor of at least 1.3 as compared to an operating phase following the starting phase.

8. The integrated circuit according to claim 1, wherein the differential oscillator has an LC resonant circuit and two transistors connected to the LC resonant circuit, the transistors forming a negative differential resistance value for the oscillation of the differential oscillator.

9. An integrated circuit comprising:
   a differential oscillator; and
   a starting circuit connected to the differential oscillator,
   wherein the differential oscillator has a current mirror for setting an operating current through each of its two branches,
   wherein the starting circuit has at least one switch connected to the current mirror and has a starter connected to the at least one switch,
   wherein the current mirror, the at least one switch, and the starter are wired in such a manner that an operating current in each of the two branches of the differential oscillator is increased during a starting chase that is a function of the starter,
   wherein the differential oscillator has an LC resonant circuit and two transistors connected to the LC resonant circuit, the transistors forming a negative differential resistance value for the oscillation of the differential oscillator, and
   wherein the two transistors connected to the LC resonant circuit are part of the current mirror.

10. The integrated circuit according to claim 2, wherein the timing element produces a duration of the starting phase that corresponds to a minimum of the product of a quality factor of the LC resonant circuit and a duration of one period of the oscillation.

11. The integrated circuit according to claim 8,
    wherein the two transistors connected to the LC resonant circuit are wired in a common emitter circuit,
    wherein the emitters of the two transistors are connected to a supply voltage terminal of the oscillator through a number of resistors in order to set the operating current.

12. The integrated circuit according to claim 11, wherein the emitters are short-circuited with regard to an oscillator frequency band of the differential oscillator through a number of capacitors.

13. The integrated circuit according to claim 11,
    wherein each emitter of the relevant branch of the oscillator is connected to the supply voltage terminal through a series circuit of resistors, and
    wherein the at least one resistor of the series circuit is connected to the at least one switch in such a manner that the at least one resistor is bridged by the at least one switch for the starting phase to increase the operating current.

14. The integrated circuit according to claim 11, wherein each of the two transistors, in common emitter circuits with the resistors connected to the emitters, constitutes a mirror branch of the current mirror, and wherein bases of the two transistors in the common emitter circuits are coupled to an additional mirror branch of the current mirror.

15. The integrated circuit according to claim 14,
    wherein the additional mirror branch has a mirror transistor and a series circuit of resistors,
    wherein the series circuit of resistors is connected to the mirror transistor and the supply voltage terminal, and
    wherein at least one resistor of the series circuit is connected to the at least one switch in such a manner that the at least one resistor is not bridged by the at least one switch to increase the operating current for the starting phase.

16. The integrated circuit according to claim 1, wherein the differential oscillator is designed to be tunable.

17. A receiver of a global positioning system comprising:
    an antenna for receiving satellite signals;
    a receiver circuit that has an integrated circuit with a differential oscillator having a first circuit section with an oscillator signal and a second circuit section separated from the oscillator signal by a number of impedances in the manner of a decoupling; and
    a starting circuit,
    wherein the differential oscillator and the starting circuit are connected to one another,
    wherein the differential oscillator has a current mirror for setting an operating current through each of two branches,
    wherein the starting circuit has at least one switch connected to the current mirror in the second circuit section, and has a timing element as a starter for the oscillator that is connected to the switch, and wherein the current mirror, the at least one switch, and the timing element functioning as the starter are wired in such a manner that the operating current in each of the two branches of the differential oscillator is increased during a starting phase, wherein the starting phase is a function of the timing element functioning as the starter.

* * * * *